United States Patent
Burgess

(10) Patent No.: US 9,818,575 B2
(45) Date of Patent: Nov. 14, 2017

(54) LOW PROFILE EXTRACTION ELECTRODE ASSEMBLY

(71) Applicant: Varian Semiconductor Equipment Associates, Inc., Gloucester, MA (US)

(72) Inventor: Jeffrey A. Burgess, Manchester By-The-Sea, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/942,239

(22) Filed: Nov. 16, 2015

(65) Prior Publication Data

US 2017/0140895 A1    May 18, 2017

(51) Int. Cl.
   *H01J 37/147*    (2006.01)
   *H01J 37/317*    (2006.01)

(52) U.S. Cl.
   CPC ...... *H01J 37/1471* (2013.01); *H01J 37/3171* (2013.01)

(58) Field of Classification Search
   USPC ...................................................... 250/396 R
   See application file for complete search history.

(56) References Cited

U.S. PATENT DOCUMENTS

| | | | | |
|---|---|---|---|---|
| 6,639,227 B1 * | 10/2003 | Glavish | ............... | H01J 37/05 250/296 |
| 7,421,973 B2 * | 9/2008 | Kellerman | ............... | H01J 37/08 118/723 CB |
| 7,842,934 B2 * | 11/2010 | Tekletsadik | ............... | H01J 37/16 174/110 R |
| 2005/0151089 A1 | 7/2005 | Bong | | |
| 2010/0072402 A1 | 3/2010 | Satoh | | |

FOREIGN PATENT DOCUMENTS

| JP | 2004152690 A | 5/2004 |
|---|---|---|
| JP | 2006004826 A | 1/2006 |
| KR | 1020080051862 A | 6/2008 |

OTHER PUBLICATIONS

ISR and Written Opinion dated Dec. 21, 2016 in corresponding PCT/US2016/053298.

* cited by examiner

*Primary Examiner* — Phillip A Johnston

(57) ABSTRACT

A low profile extraction electrode assembly including an insulator having a main body, a plurality of spaced apart mounting legs extending from a first face of the main body, a plurality of spaced apart mounting legs extending from a second face of the main body opposite the first face, the plurality of spaced apart mounting legs extending from the second face offset from the plurality of spaced apart mounting legs extending from the first face in a direction orthogonal to an axis of the main body, the low profile extraction electrode assembly further comprising a ground electrode fastened to the mounting legs extending from the first face, and a suppression electrode fastened to the mounting legs extending from the second face, wherein a tracking distance between the ground electrode and the suppression electrode is greater than a focal distance between the ground electrode and the suppression electrode.

3 Claims, 3 Drawing Sheets

LOW PROFILE EXTRACTION ELECTRODE ASSEMBLY

FIELD OF THE DISCLOSURE

Embodiments of the present disclosure relate to the field of semiconductor and solar cell processing, and more particularly to a low profile, high voltage insulator for facilitating close proximity coupling of extraction electrodes in an ion beam implanter.

BACKGROUND OF THE DISCLOSURE

Ion implantation is a technique for introducing conductivity-altering impurities into a workpiece such as a wafer or other substrate. A desired impurity material is ionized in an ion source of an ion beam implanter, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Conventional ion beam implanters often include a number of extraction electrodes, including a suppression electrode and a ground electrode, configured to extract an ion beam from an ion source and to manipulate (e.g., focus and/or direct) the ion beam in a desired manner. The extraction electrodes are commonly mounted on an electrode positioning system including a motorized manipulator arm for facilitating selective movement of the extraction electrodes relative to the ion source. For example, if an ion beam is out of focus when initially extracted from the ion source, the manipulator arm may reposition the extraction electrodes in a corrective manner to focus the ion beam in a desired manner.

Due to a large difference in electrical potential between a ground electrode and a suppression electrode during operation of an ion implanter electrically insulating the electrodes from one another is performed to prevent or mitigate the flow of electrical current therebetween. Particularly, the ground electrode is separated from the suppression electrode with an electrical insulator. A shortest distance measured along a surface of the insulator between the electrodes, commonly referred to as a "tracking distance," achieves a desired degree of physical separation and electrical insulation between the electrodes. Maintaining a specific distance, hereinafter referred to as a "focal distance," between a ground electrode and a suppression electrode is generally performed in order to focus an extracted ion beam in a desired manner.

Focal distances are typically shorter than tracking distances. Thus, in order to maintain a desired focal distance between a ground electrode and a suppression electrode while simultaneously providing a tracking distance of desired length between the electrodes, ground electrodes and a suppression electrodes are often coupled to one another using complex mounting arrangements including multiple connective and supportive structures (e.g., support arms, mechanical fasteners, etc.) having associated manufacturing tolerances. When aggregated, these manufacturing tolerances can result in an undesirable offset or eccentricity between a ground electrode and a suppression electrode, adversely affecting the focus and/or alignment of an extracted ion beam. Additionally, the various supportive and connective structures used to couple a ground electrode and a suppression electrode may be formed of various materials having different coefficients of thermal expansion, and/or may be subject to uneven heating during operation of an ion implanter. This may lead to incongruous thermal expansion and contraction of the supportive and connective structures, further exacerbating eccentricity between the ground electrode and suppression electrode.

It is with respect to these and other considerations the current improvements may be useful.

SUMMARY

This Summary is provided to introduce a selection of concepts in a simplified form further described below in the Detailed Description. This Summary is not intended to identify key features or essential features of the claimed subject matter, nor is this Summary intended as an aid in determining the scope of the claimed subject matter.

An exemplary embodiment of a low profile extraction electrode assembly in accordance with the present disclosure may include an insulator, a ground electrode fastened to a first side of the insulator, and a suppression electrode fastened to a second side of the insulator opposite the first side, wherein a tracking distance between the ground electrode and the suppression electrode is greater than a focal distance between the ground electrode and the suppression electrode.

Another exemplary embodiment of a low profile extraction electrode assembly in accordance with the present disclosure may include an insulator having a circular main body, three mounting legs extending from a first face of the main body and spaced apart from one another around an axis of the main body, and three mounting legs extending from a second face of the main body opposite the first face and spaced apart from one another around the axis of the main body, the three mounting legs extending from the second face offset from the three mounting legs extending from the first face around the axis of the main body, the low profile extraction electrode assembly further including a ground electrode fastened to the three mounting legs extending from the first face, a suppression electrode fastened to the three mounting legs extending from the second face, first and second outer particulate shields extending from the ground electrode radially outward of the insulator, and first and second inner particulate shields extending from the ground electrode radially inward of the insulator, the first outer particulate shield radially overlapping the second outer particulate shield and the first inner particulate shield radially overlapping the second inner particulate shield.

An exemplary embodiment of an ion implanter in accordance with the present disclosure may include a source chamber, an ion source disposed within the source chamber and configured to generate an ion beam, and a low profile extraction electrode assembly disposed within the source chamber adjacent the ion source and configured to extract and focus the ion beam, the low profile extraction electrode assembly including an insulator, a ground electrode fastened to a first side of the insulator, and a suppression electrode fastened to a second side of the insulator opposite the first side, wherein a tracking distance between the ground electrode and the suppression electrode is greater than a focal distance between the ground electrode and the suppression electrode.

BRIEF DESCRIPTION OF THE DRAWINGS

By way of example, various embodiments of the disclosed apparatus will now be described, with reference to the accompanying drawings, wherein:

FIG. 2b is a rear isometric view illustrating the exemplary extraction electrode assembly shown in FIG. 2a;

DETAILED DESCRIPTION

Figure 1:
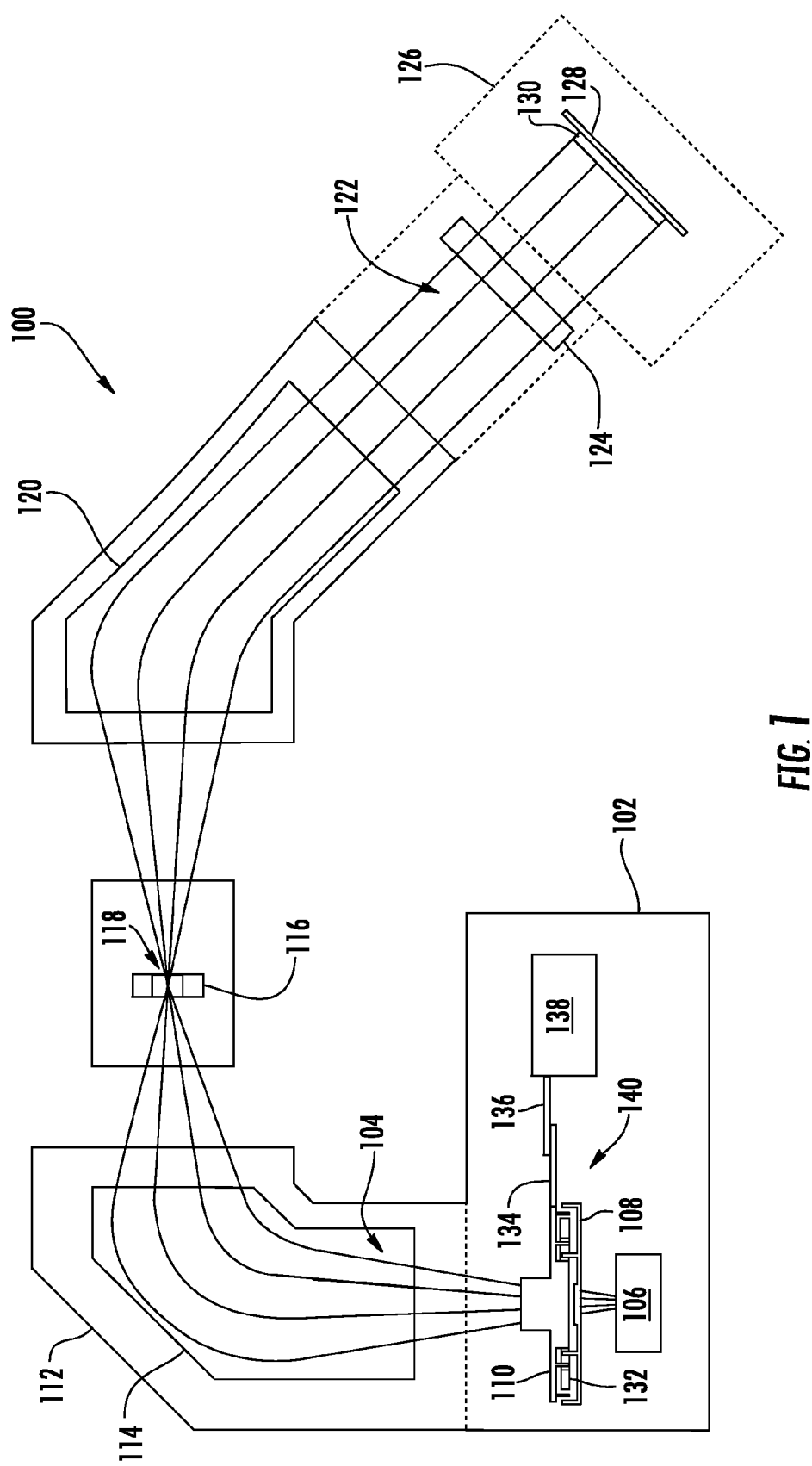
FIG. 1 is a schematic plan view illustrating an exemplary embodiment of a beam line ion implanter in accordance with the present disclosure.

A low profile extraction electrode assembly for facilitating close proximity coupling of electrodes in an ion beam implanter in accordance with the present disclosure will now be described more fully hereinafter with reference to the accompanying drawings, wherein certain exemplary embodiments of the extraction electrode assembly are presented. The extraction electrode assembly may be embodied in many different forms and is not to be construed as being limited to the embodiments set forth herein. These embodiments are provided so this disclosure will be thorough and complete, and will fully convey the scope of the extraction electrode assembly to those skilled in the art. In the drawings, like numbers refer to like elements throughout.

FIG. 1 is a schematic diagram of a beam-line ion implanter 100 (hereinafter "the implanter 100"). Those skilled in the art will recognize the implanter 100 is one of many examples of beam-line ion implanters capable of producing and directing an ion beam for doping substrates. Thus, the insulator described herein is not limited to application solely in the exemplary implanter 100 shown in FIG. 1. Additionally, the implanter 100 is not restricted to "beam-line" designs, and could include other types of ion implanters based on plasma immersion, flood, or other plasma source designs, for example.

Generally, the implanter 100 may include a source chamber 102 configured to generate ions for forming an ion beam 104. The source chamber 102 may include an ion source 106 where a feed gas supplied to the ion source 106 is ionized. This feed gas may be, or may include or contain, hydrogen, helium, other rare gases, oxygen, nitrogen, arsenic, boron, phosphorus, aluminum, indium, gallium, antimony, carborane, alkanes, another large molecular compound, or other p-type or n-type dopants, for example. The generated ions may be extracted from the ion source 106 by a series of extraction electrodes, including a suppression electrode 108 and a ground electrode 110, configured to focus and direct the ion beam 104 as further described below. The extracted ion beam 104 may be mass analyzed by a mass analyzer 112 including a resolving magnet 114 and a masking electrode 116 having a resolving aperture 118. The resolving magnet 114 may deflect ions in the ion beam 104 so ions having a desired mass-to-charge ratio associated with a particular dopant ion species are allowed to pass through the resolving aperture 118. The undesired ion species do not pass through the resolving aperture 118 since the undesired ion species are blocked by the masking electrode 116.

Ions of the desired ion species may pass through the resolving aperture 118 to an angle corrector magnet 120. The angle corrector magnet 120 may deflect ions of the desired ion species and may thus convert the ion beam from a diverging ion beam to a ribbon ion beam 122 having generally parallel ion trajectories. The implanter 100 may further include acceleration and/or deceleration units in some embodiments. Acceleration and deceleration units may be used in ion implant systems to speed up or slow down an ion beam. Speed adjustment is accomplished by applying specific combinations of voltage potentials to sets of electrodes disposed on opposite sides of an ion beam. As an ion beam passes between the electrodes, ion energies are increased or decreased depending on the applied voltage potentials. Since the depth of an ion implant is proportional to the energy of an impinging ion beam, beam acceleration may be desirable when performing deep ion implants. Conversely, where shallow ion implants are desired, beam deceleration may be performed to ensure impinging ions travel just a short distance into a workpiece. The exemplary implanter 100 shown in FIG. 1 includes a deceleration unit 124.

An end station 126 of the implanter 100 may include a platen 128 configured to support one or more workpieces, such as a substrate 130, disposed in the path of the ribbon ion beam 122 so ions of a desired species are implanted into the substrate 130. The substrate 130 may be, for example, a semiconductor wafer, solar cell, etc. The end station 126 also may include a scanner (not shown) for moving the substrate 130 in a direction perpendicular to the long dimension of the ribbon ion beam 122 cross-section, accordingly distributing ions over the entire surface of the substrate 130. Although a ribbon ion beam 122 is illustrated, other embodiments of the implanter 100 may provide a spot beam. The entire path traversed by the ion beam is evacuated during ion implantation. The implanter 100 may further include additional components known to those skilled in the art and may incorporate hot or cold implantation of ions in some embodiments.

Still referring to FIG. 1, the suppression electrode 108 and the ground electrode 110 may be coupled to one another by a low profile, high voltage insulator 132 (hereinafter "the insulator 132") for electrically insulating the suppression electrode 108 from the ground electrode 110 while holding the suppression electrode 108 at a desired distance from the ground electrode 110 as described in greater detail below. The ground electrode 110 may include a mounting arm 134 coupled to a manipulator arm 136 of an ion beam manipulator 138 (hereinafter "the manipulator 138") located within the source chamber 102. The manipulator 138 may be provided for selectively adjusting the positions of the interconnected suppression electrode 108, insulator 132, and ground electrode 110 (hereinafter referred to collectively as "the extraction electrode assembly 140") relative to the ion source 106 for focusing the extracted ion beam 104 in a desired manner. In an alternative embodiment, the mounting arm 134 may extend from the suppression electrode 108 instead of from the ground electrode 110. In another alternative embodiment, the mounting arm 134 may be omitted and the manipulator arm 136 may be coupled directly to the ground electrode 110 or to the suppression electrode 108. In another alternative embodiment, the manipulator may be located partly or entirely outside of the source chamber 102.

Figure 2A:
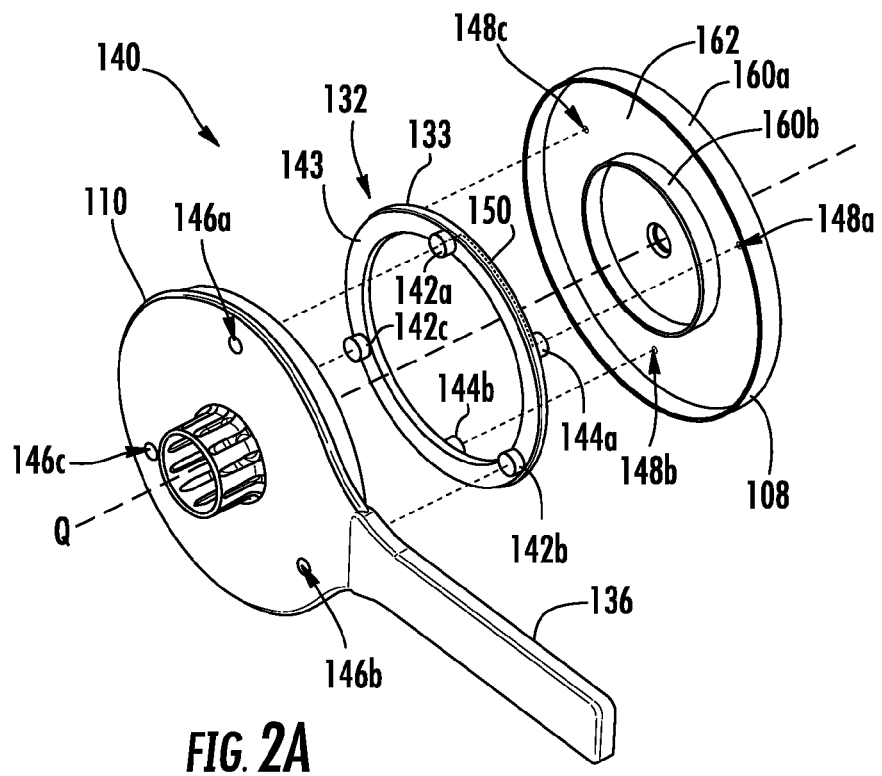
FIG. 2a is a front isometric view illustrating an exemplary extraction electrode assembly in accordance with an embodiment of the present disclosure.
Figure 2B:
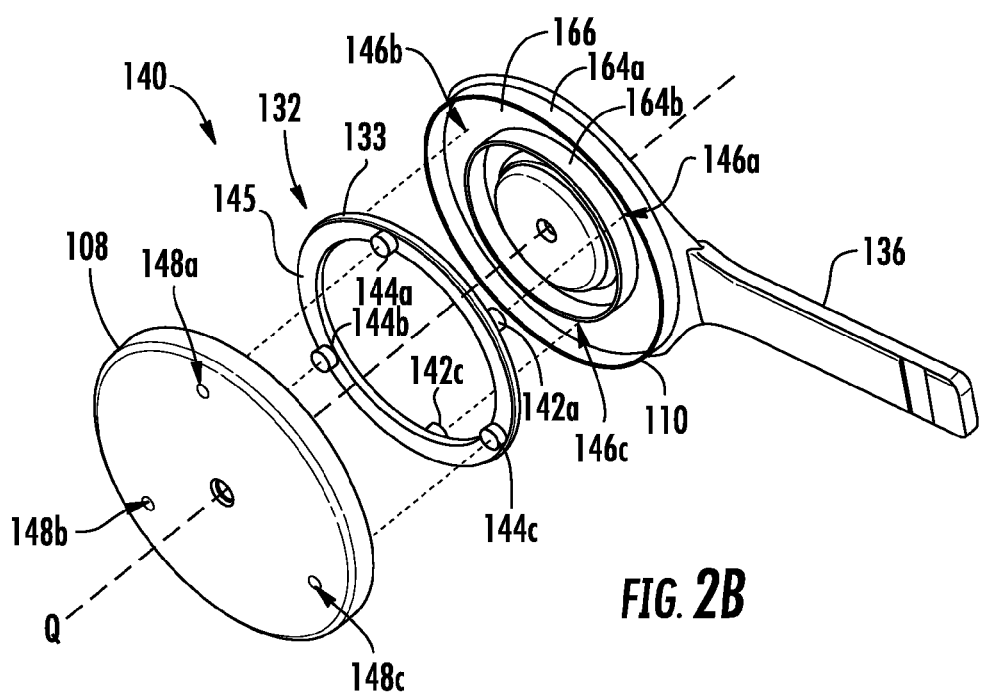

Referring to FIGS. 2a and 2b, front and rear exploded isometric views illustrating the extraction electrode assembly 140 of the implanter 100 are shown. The insulator 132 of the extraction electrode assembly 140 may be formed of an electrically insulating, temperature resistant material suitable for use within the source chamber 102 (FIG. 1), such materials including quartz, ceramics such as alumina and zirconia, various thermoplastics, and high temperature thermosets such as epoxy. The insulator 132 may include a main body 133 having a first plurality of mounting legs 142a, 142b, 142c extending from a first face 143 thereof, and having a second plurality of mounting legs 144*a*, 144*b*, 144*c* extending from a second face 145 thereof opposite the first face 143. In the illustrated example, the main body 133 is circular. Other shapes are contemplated and may be implemented as further described below. The mounting legs 142*a*, 142*b*, 142*c* may be circumferentially spaced 120 degrees apart from one another around an imaginary central axis Q of the main body 133. Similarly, the mounting legs 144*a*, 144*b*, 144*c* may be circumferentially spaced 120 degrees apart from one another around the imaginary central axis Q. The mounting legs 144*a*, 144*b*, 144*c* may be circumferentially offset from the mounting legs 142*a*, 142*b*, 142*c* by 60 degrees around the imaginary central axis Q. The insulator 132 may have an overall thickness (i.e., a maximum dimension in a direction parallel to the imaginary central axis Q) in a range of 1 millimeter to 20 millimeters, for example.

The mounting legs 142*a*, 142*b*, 142*c* of the insulator 132 may be fastened to the ground electrode 110, such as by mechanical fasteners (not shown) extending through the mounting legs 142*a*, 142*b*, 142*c* and through respective mounting holes 146*a*, 146*b*, 146*c* in the ground electrode 110. Similarly, the mounting legs 144*a*, 144*b*, 144*c* of the insulator 132 may be fastened to the suppression electrode 108, such as by mechanical fasteners (not shown) extending through the mounting legs 144*a*, 144*b*, 144*c* and through respective mounting holes 148*a*, 148*b*, 148*c* in the suppression electrode 108. Assembled thusly, the extraction electrode assembly 140, and particularly the insulator 132 of the extraction electrode assembly 140, may provide desired electrical insulation between the suppression electrode 108 and the ground electrode 110 while also maintaining a desired "tracking distance" and a desired "focal distance" between the suppression electrode 108 and the ground electrode 110, wherein "tracking distance" is defined herein as a shortest distance measured along a surface of the insulator 132 between the suppression electrode 108 and the ground electrode 110, and wherein "focal distance" is defined herein as a distance measured along the imaginary central axis Q between the suppression electrode 108 and the ground electrode 110. Particularly, as indicated by the dashed line 150 in FIG. 2*a*, the tracking distance between the suppression electrode 108 and the ground electrode 110 may be the sum of a length of one of the mounting legs 142*a* extending from the first face 143 of the main body 133, the length of one of the circumferentially adjacent mounting legs 144*a* extending from the second face 145 of the main body 133, the length of the circumferential segment of the insulator 132 extending between the mounting leg 142*a* and the mounting leg 144*a*, and the thickness of the main body 133. Expressed another way, the tracking distance between the suppression electrode 108 and the ground electrode 110 may be the sum of the overall thickness of the insulator 132 and the length of the circumferential segment of the insulator 132 extending between the mounting leg 142*a* and the mounting leg 144*a*.

Figure 3:
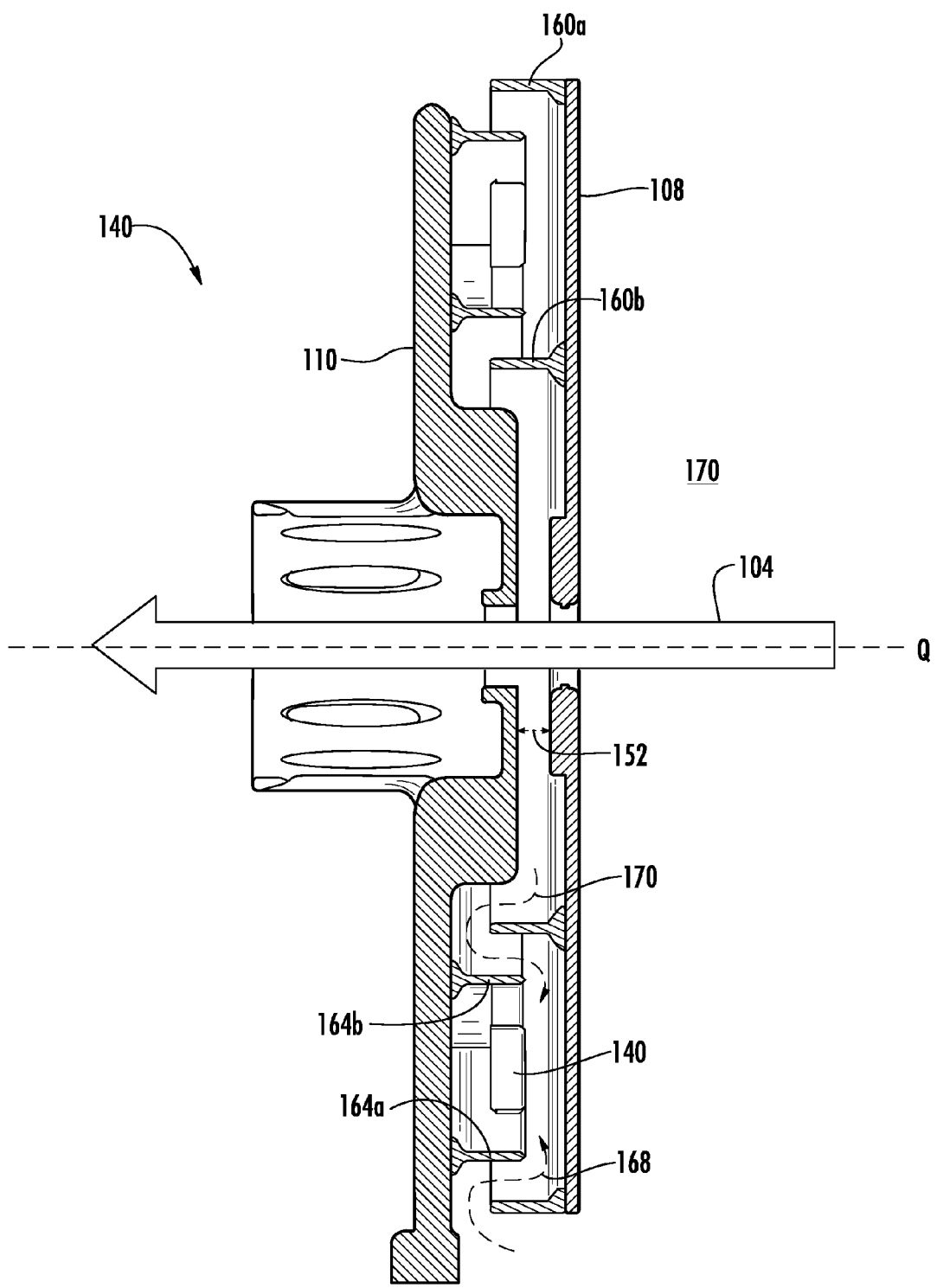
FIG. 3 is a cross sectional side view illustrating the exemplary extraction electrode assembly shown in FIGS. 2a and 2b.

Thus, owing to the circumferential offset of the mounting legs 144*a*, 144*b*, 144*c* relative to the mounting legs 142*a*, 142*b*, 142*c*, the tracking distance between the suppression electrode 108 and the ground electrode 110 may be significantly greater than the focal distance between the suppression electrode 108 and the ground electrode 110. For example, if the diameter of the insulator 132 is 4.88 inches and the overall thickness of the insulator 132 is 0.67 inches, the tracking distance between the suppression electrode 108 and the ground electrode 110 may be 3.23 inches, whereas the focal distance between the suppression electrode 108 and the ground electrode 110, indicated by the dashed line 152 in FIG. 3, may be 0.197 inches. This relationship is achieved in the absence of additional structures or components (i.e., structures or components other than the insulator 132), such as complex mounting arm arrangements employing multiple couplings, for connecting and/or insulating the suppression electrode 108 and the ground electrode 110. Since the suppression electrode 108 and the ground electrode 110 are coupled directly to one another by the insulator 132 in the absence of any other intervening structures or components, eccentricity between the suppression electrode 108 and the ground electrode 110, otherwise possibly caused by uneven thermal expansion and/or contraction of such intervening structures or components during operation of the implanter 100, is avoided.

In various alternative embodiments, the insulator 132 may be implemented with a greater or fewer number of mounting legs (i.e. greater or fewer than three mounting legs 142*a*, 142*b*, 142*c* extending from the first face 143 of the main body 133 and/or greater or fewer than three mounting legs 144*a*, 144*b*, 144*c* extending from the second face 145 of the main body 133). In one example, two mounting legs may extend from the first face 143 of the main body and two mounting legs may extend from the second face 145 of the main body 133, wherein the two mounting legs extending from the first face 143 are circumferentially spaced 180 degrees apart from one another around the imaginary central axis Q, the two mounting legs extending from the second face 145 are circumferentially spaced 180 degrees apart from one another around the imaginary central axis Q, and the two mounting legs extending from the first face 143 are circumferentially offset from the two mounting legs extending from the second face 145 by 90 degrees around the imaginary central axis Q. In another example, four mounting legs may extend from the first face 143 of the main body and four mounting legs may extend from the second face 145 of the main body 133, wherein the four mounting legs extending from the first face 143 are circumferentially spaced 90 degrees apart from one another around the imaginary central axis Q, the two mounting legs extending from the second face 145 are circumferentially spaced 90 degrees apart from one another around the imaginary central axis Q, and the four mounting legs extending from the first face 143 are circumferentially offset from the four mounting legs extending from the second face 145 by 45 degrees around the imaginary central axis Q.

In various alternative embodiments, the insulator 132 may be implemented with a main body 133 having a shape other than circular. For example, the main body 133 of the insulator 132 may be oval, rectangular, star-shaped, Z-shaped, H-shaped, irregularly shaped, etc. Such alternative embodiments of the insulator 132 may be implemented with pluralities of mounting legs similar to the mounting legs 142*a*, 142*b*, 142*c* and 144*a*, 144*b*, 144*c*, with a first plurality of mounting legs extending from a first face 143 of the main body 133 for connection to the ground electrode 110 and a second plurality of mounting legs extending from a second face 145 of the main body 133 for connection to the suppression electrode 108, wherein the mounting legs extending from the second face 145 of the main body 133 are offset from the mounting legs extending from the first face 143 of the main body 133 in a direction orthogonal to a central axis of the main body 133 (e.g., the central axis Q shown in FIGS. 2*a* and 2*b*), thus creating a non-linear path along a surface of the insulator 132, wherein a tracking distance between the ground electrode 110 and the suppression electrode 108 is measured along such non-linear path.

Referring to FIG. 2a, the suppression electrode 108 may have a pair of annular, radially spaced apart, outer particulate shields 160a, 160b extending from a front face 162 thereof toward the ground electrode 110. Referring to FIG. 2b, the ground electrode 110 may have a pair of annular, radially spaced apart, inner particulate shields 164a, 164b extending from a rear face 166 thereof toward the suppression electrode 108. As best shown in the side cross section of the extraction electrode assembly illustrated in FIG. 3, the outer particulate shields 160a, 160b and the inner particulate shields 164a, 164b may be disposed in a radially overlapping arrangement with the outer particulate shield 160a disposed radially outside of the inner particulate shield 164a and with the outer particulate shield 160b disposed radially inside of the inner particulate shield 164b. Arranged thusly, the outer particulate shield 160a and the inner particulate shield 164a may define a tortuous path 168 for mitigating the migration of particulate from the external environment 170 to the insulator 132. Similarly, the outer particulate shield 160b and the inner particulate shield 164b may define a tortuous path 172 for mitigating the migration of particulate from the ion beam 104 to the insulator 132. The outer particulate shields 160a, 160b and the inner particulate shields 164a, 164b may thus cooperate to mitigate the accumulation of particulate on the insulator 132, wherein such accumulation could otherwise increase the electrical conductivity of the insulator 132 and compromise the ability of the insulator 132 to electrically insulate the suppression electrode 108 from the ground electrode 110 in a desired manner.

In view of the foregoing description, those of ordinary skill in the art will appreciate numerous advantages provided by the extraction electrode assembly 140, and particularly the insulator 132, relative to other extraction electrode assemblies and insulators commonly employed in ion beam implanters. For example, a first advantage conferred by the disclosed insulator 132 is a desired tracking distance and a desired focal distance may be maintained between the suppression electrode 108 and the ground electrode 110 in the absence of additional structures or components (i.e., structures or components other than the insulator 132), such as complex mounting arm arrangements employing multiple couplings, for connecting and/or insulating the suppression electrode 108 and the ground electrode 110. Another advantage conferred by the disclosed insulator 132 is, since the suppression electrode 108 and the ground electrode 110 are coupled directly to one another by the insulator 132 in the absence of any other intervening structures or components, eccentricity between the suppression electrode 108 and the ground electrode 110, otherwise possibly caused by uneven thermal expansion and/or contraction of such intervening structures or components during operation of the implanter 100, is avoided. Yet another advantage conferred by the disclosed insulator 132 is reduced cost and complexity relative to other extraction electrode insulators having complex structures involving multiple mounting arms and/or numerous points of attachment for achieving a desired tracking distance, a desired focal distance, and adequate electrical insulation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize its usefulness is not limited thereto and the present disclosure may be beneficially implemented in any number of environments for any number of purposes. Accordingly, the claims set forth below are to be construed in view of the full breadth and spirit of the present disclosure as described herein.

The invention claimed is:

1. A low profile extraction electrode assembly comprising:
   an insulator;
   a ground electrode fastened to a first side of the insulator; and
   a suppression electrode fastened to a second side of the insulator opposite the first side;
   wherein a tracking distance between the ground electrode and the suppression electrode is greater than a focal distance between the ground electrode and the suppression electrode, and wherein the tracking distance between the ground electrode and the suppression electrode extends along a circumference of the insulator and is greater than an overall thickness of the insulator.

2. An ion implanter, comprising:
   a source chamber;
   an ion source disposed within the source chamber and configured to generate an ion beam; and
   a low profile extraction electrode assembly disposed within the source chamber adjacent the ion source and configured to extract and focus the ion beam, the low profile extraction electrode assembly comprising:
   an insulator;
   a ground electrode fastened to a first side of the insulator; and
   a suppression electrode fastened to a second side of the insulator opposite the first side;
   wherein a tracking distance between the ground electrode and the suppression electrode is greater than a focal distance between the ground electrode and the suppression electrode, and wherein the tracking distance between the ground electrode and the suppression electrode extends along a circumference of the insulator and is greater than an overall thickness of the insulator.

3. The ion implanter of claim 2, wherein one of the ground electrode and the suppression electrode is coupled to a manipulator for selectively adjusting a position of the extraction electrode assembly.

* * * * *